United States Patent [19]

Fathauer et al.

[11] Patent Number: 5,365,054
[45] Date of Patent: Nov. 15, 1994

[54] OPTICAL DETECTOR HAVING A PLURALITY OF MATRIX LAYERS WITH COBALT DISILICIDE PARTICLES EMBEDDED THEREIN

[75] Inventors: Robert W. Fathauer, Sunland, Calif.; Leo Schowalter, Latham, N.Y.

[73] Assignee: The United States of America as represented by the Administrator of the National Aeronautics and Space Administration, Washington, D.C.

[21] Appl. No.: 115,962

[22] Filed: Aug. 25, 1993

Related U.S. Application Data

[62] Division of Ser. No. 912,961, Jul. 10, 1992, Pat. No. 5,273,617.

[51] Int. Cl.$^5$ .............................................. H01J 40/14
[52] U.S. Cl. .................................. 250/214.1; 257/456; 437/5
[58] Field of Search ................ 250/214.1, 214 R; 257/452–456; 437/5, 2, 21, 22; 156/613

[56] References Cited

U.S. PATENT DOCUMENTS 4,409,724 10/1983 Tasch, Jr. et al. .................... 257/72
4,690,714 9/1987 Li ............................................ 437/2

*Primary Examiner*—David C. Nelms
*Assistant Examiner*—Que T. Le
*Attorney, Agent, or Firm*—John H. Kusmiss; Thomas H. Jones; Guy M. Miller

[57] ABSTRACT

Silicon and metal are coevaporated onto a silicon substrate in a molecular beam epitaxy system with a larger than stoichiometric amount of silicon so as to epitaxially grow particles of metal silicide embedded in a matrix of single crystal epitaxially grown silicon. The particles interact with incident photons by resonant optical absorption at the surface plasmon resonance frequency. Controlling the substrate temperature and deposition rate and time allows the aspect ratio of the particles to be tailored to desired wavelength photons and polarizations. The plasmon energy may decay as excited charge carriers or phonons, either of which can be monitored to indicate the amount of incident radiation at the selected frequency and polarization.

22 Claims, 1 Drawing Sheet

OPTICAL DETECTOR HAVING A PLURALITY OF MATRIX LAYERS WITH COBALT DISILICIDE PARTICLES EMBEDDED THEREIN

This is a division of application Ser. No. 07/912,961, filed Jul. 10, 1992, now U.S. Pat. No. 5,273,617.

ORIGIN OF THE INVENTION

The invention described herein was made in the performance of work under a NASA contract and is subject to the provisions of Section 305 of the National Aeronautics and Space Act of 1958, public law 83-568 (72 Stat. 435; 42 USC 2457).

TECHNICAL FIELD

The present invention resides in the art of making optical components with both linear and non-linear characteristics, in a silicon based system, using the techniques of molecular beam epitaxy. More specifically, a new process is disclosed that allows optical layers and elements to be tailored to have desired optical properties for use in detectors, filters, amplifiers, optical computers, memories, and other silicon based structures requiring selectable linear and non-linear optical properties.

BACKGROUND OF THE INVENTION

Molecular beam epitaxy (MBE) may be used to deposit metal and semiconductor compounds onto substrates such as silicon so as to form infrared and visible light affecting matrixes. A process to do this is disclosed in patent application Ser. No. 07/524,959, filed May 18, 1990 by one of the inventors of the present application, Robert W. Fathauer. The teachings of this prior patent are incorporated herein by reference.

In the process of the above referenced patent, molecules of a vaporized material are directed onto the surface of a substrate at a selected rate. The arriving molecules remain mobile on the surface for a short time. Thus, each molecule has time to locate a preferred site upon which to attach so that a regular crystal growth is facilitated. Column like structures grow epitaxially up from the substrate surface. The orientation, height, width, shape, and spacing of the columns are all selectable by modification of the processing parameters rather than by masking. A large variety of desired three dimensional shapes may be generated. Specifically, the above referenced patent discloses that metal and silicon are deposited onto a silicon substrate in ratios well removed from stoichiometric with a large excess of silicon. Given the correct growth environment, columns of single crystal metal silicide epitaxially grow upward from the silicon substrate surface. The columns are embedded in a surrounding matrix of single crystal silicon. It has been determined that the spacing, thickness, and height of the columns may be chosen by varying the process parameters. Alternatively, the location and shape of the columns may be selected by seeding the substrate in the places where columns are desired.

If the deposited metal is cobalt, cobalt disilicide columns are formed. Other metals or even semiconductors may be used, but cobalt disilicide is an effective and well understood material. When photons strike metal silicides like cobalt disilicide, they may be absorbed. The above referenced patent teaches a structure to maximize this absorption effect in which many short column like particles of silicide are grown inside a matrix of silicon to produce a three dimensional cloud of silicide particles that is more likely to intercept photons. The present invention improves upon this structure by producing silicide particles that can be tailored to interact with selected wavelengths of light in a linear or non-linear manner.

SUMMARY OF THE INVENTION

Briefly, the instant invention contemplates adjusting the silicide particle growth parameters so as to generate particles having specific shapes and orientations. The most important shape parameter is the aspect ratio: the ratio of the elongated dimension of the particle to the perpendicular shorter dimension. By choosing the shape and orientation of the silicide particles, the matrix of particles can be tailored to interact better with specific wavelengths of light.

For example, if the light is received perpendicular to the plane of the substrate, so that the electric field is parallel to the substrate, and the column like particles are grown to be perpendicular to the substrate as well, then taller or thinner particles (those with higher aspect ratios) are more responsive to shorter wavelengths. Lower aspect ratio particles having either greater diameters, shorter lengths, or both, are more responsive to longer wavelengths.

However, if the particles are oriented more parallel to the substrate, so as to be more parallel to the electric field of the incident light, higher aspect ratio particles will respond more to longer wavelengths. This is because when the electric field of the light is aligned with the longer dimension of the silicide particles, longer wavelength resonance is experienced. The ability to selectively interact with photons allows many new silicon based optical devices to be constructed. Silicon is a desirable material because integrated circuitry can be fabricated with the optical matrix components. Also, silicon has attractive mechanical and thermal properties. Examples of devices that could use wavelength specific optical layers include optical computing elements, holographic devices, optical correlators, optical phase conjugators, bistable memory devices, optical limiters, polarization filters, and infrared and visible light detectors. Two kinds of light detectors are described hereinafter that utilize optical components constructed according to the principles of the present invention. But the utility of the invention is not limited just to detectors.

The transfer of energy from the photon to the silicide particle takes place by surface plasmon resonance. Afterwards, the plasmon can decay into the excitation of a single charge carrier, a hole or an electron, so as to be electronically detectable as a current change in the silicon matrix surrounding the silicide particles. Alternatively, the plasmon may decay by mechanisms that heat the silicon matrix. This heat can be measured to detect the capture of the photon. With either readout, an efficient optical detector may be built that can be optimized for a particular wavelength of light and tailored to the linear and non-linear optical properties that may be encountered in the detector structure. Additional benefits and advantages are explained in the following detailed description and the drawings referenced thereby.

DETAILED DESCRIPTION OF THE INVENTION

Figure 1:
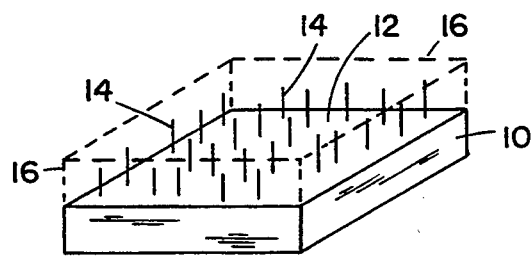
FIG. 1 schematically shows the molecular beam epitaxy process used to form the optically tailored silicide particles.

FIG. 1 demonstrates the basic process used to create the silicide particle shapes that respond to selected wavelength photons. A silicon substrate 10 is processed in a high vacuum MBE system chamber. Substrate 10 is cleaned by standard techniques well known to those skilled in the art so as to produce an atomically clean surface 12. Substrate 10 is heated to a temperature such that arriving atoms of the deposit ion material have an interval of movement on surface 12 sufficient to locate the desired bonding sites. For the metal silicides, temperatures in the range of 640 to 800 degrees centigrade have been successfully used. In this specifications, the deposited material is cobalt disilicide. But other metal silicides such as chromium disilicide may be used.

For cobalt disilicide columnar particles, cobalt and silicon are coevaporated in the MBE chamber and directed onto surface 12. The ratio of cobalt to silicon is intentionally made non-stoichiometric with an excess of silicon. This silicon rich deposition produces the particles. The cobalt atoms, being temporarily mobile on surface 12, seek out and coalesce with other cobalt disilicide molecules at random locations, establishing growth centers upon which columns 14 of single crystal cobalt silicide grow. The excess silicon forms a single crystal matrix 16, between and around columns 14, depicted as a transparent matrix 16 with dashed lines 16. The shape and locations of the columns are selectable. By raising the substrate temperature or decreasing the rate of deposition, the interval of mobility on surface 12 is lengthened so that columns are produced which are farther apart and have larger diameters. Alternatively, the ratio of silicon to metal may be changed. Less metal results in columns of the same spacing but lesser diameter. Shuttering the cobalt beam stops column growth when desired. New columns can then be initiated by unblocking the cobalt beam.

Figure 2:
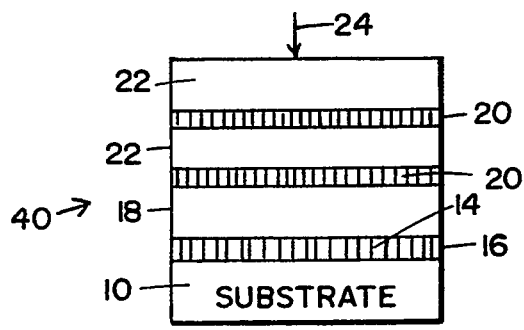
FIG. 2 is a schematic diagram of the layers of an optical detector assembled in accordance with the principles of this invention.

FIG. 2 shows a small portion of an optical detector 40 constructed using the process of FIG. 1. Substrate 10 is coated with the matrix 16 with the embedded cobalt disilicide particles 14, as in FIG. 1. The cobalt is shuttered to deposit a layer of intrinsic silicon 18, perhaps 40 nanometers thick, followed by two more matrix layers of silicide particles in silicon 20 separated by two layers of intrinsic silicon 22. Any number of alternating layers may be used, but a detector with three or four matrix layers of particles has been found to be efficient in the preferred embodiment.

Particles 14 typically have aspect ratios in the range of about one to ten. Each particle may comprise perhaps a thousand to a million atoms and are, thus, very small. They are, in fact, much smaller than the wavelength of the light being detected. This scale of microstructure requires analysis by effective medium theory which tells one how to calculate the effective dielectric constant for a composite material composed of different crystal structures. Each particle can be thought of as containing a sea of electrons, a plasma of sorts, that interacts with incident photons as a group.

The interaction can happen only in quantized units known as plasmons. The interaction is more probable for photons of a frequency corresponding to the surface plasmon resonance frequency of the silicide particles 14. This resonance frequency depends on the orientation of the particles relative to the electric field of the incident light and the shape of particles 14.

Figure 3:
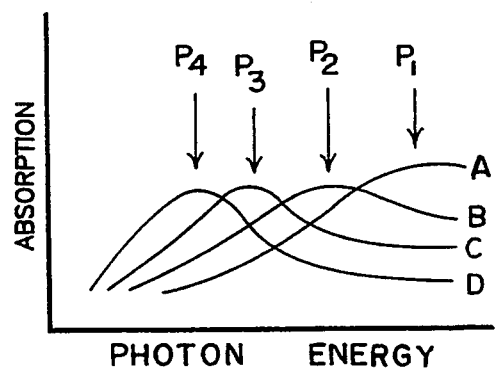
FIG. 3 is a graph showing the shift in the peak absorption wavelength for various aspect ratio particles.

FIG. 3 graphs the absorption of photons relative to their energy for four different aspect ratio particles. Four curves A, B, C, and D are shown corresponding respectively to substrate temperatures, during column deposition, of 650, 700, 750, and 800 degrees Centigrade. The progressively higher temperatures produce progressively greater diameter, and thus lower aspect ratio, particles. It can be seen that the absorption peaks, $P_1$ through $P_4$, occur at ever lower energies, associated with longer wavelength photons, for lower aspect ratio particle shape. The graph of FIG. 3 applies to the detector of FIG. 2 where light is received perpendicular to the substrate 10, as shown by arrow 24, so that the electric field of the light is perpendicular to the long dimension of particles 14. If the orientation of the elongated particles is changed relative to the electric field, the effect is reversed. An altered orientation design is shown in FIG. 4.

Figure 4:
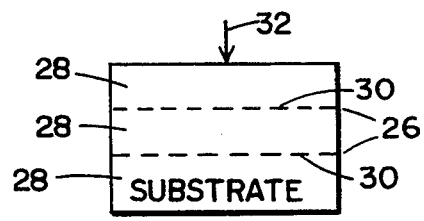
FIG. 4 shows another embodiment of the invention using different orientation particles.

In FIG. 4, several layers of particle filled matrix 26 are deposited between layers of intrinsic silicon 28. However, the particles 30 are grown as horizontally elongated structures, parallel to the electric field of incident photons 32. In this orientation, higher aspect ratio particles will have their peak absorptions shifted toward longer wavelengths.

To create the horizontal particles 30 of FIG. 4, conventional electron beam lithography methods may be used to form horizontally elongated cobalt disilicide deposits with the desired shape and position. Electron beam lithography has the advantage that the particles can be made more identical to each other and in more regular and periodic arrays. This allows a higher degree of tunability, but is more expensive. Alternatively, the horizontal particle shapes can be obtained without the cost of lithographic methods by choosing a wafer that is cut in a different plane to produce a different substrate surface for particle growth. For example, a (110) oriented wafer encourages elongated particles to form parallel to the surface.

The particle shape can be chosen to favor not only specific wavelengths, but also specific polarizations of light. If the incident light 32 is first filtered through a polarization filter, it will still be parallel to the surface of the detector, but only in a single direction. Thus, the direction of the elongate axis of particles 30 determines their effective aspect ratio relative to the incident light. Rotation of the detector, therefore, shifts the absorption peak, allowing the selection of different color light.

Figure 5:
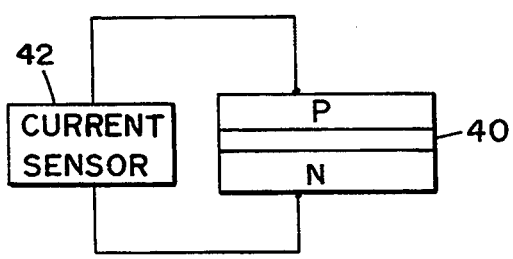
FIG. 5 shows a way to measure current created in an optical detector from absorbed photons.

Once the energy of the photon has been transferred to the particle, it may be used to create charge carriers in the silicon matrix, thus, affecting the current flow through the optical detector 40 as shown in FIG. 5. The current can be sensed by a sensor 42, connected to detector 40 through a layer of P type material and a layer of N type material, as a measure of the amount of incident radiation.

Figure 6:
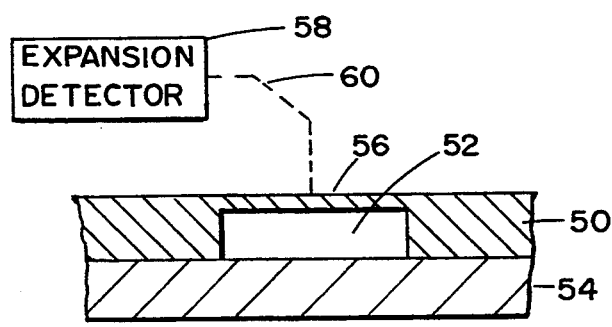
FIG. 6 shows a way to measure heat created in a detector by absorbed photons.

Alternatively, the photon added energy in the particles can be dissipated as heat energy in the lattice vibrations of the crystalline structure as shown in FIG. 6. FIG. 6 comprises a schematic diagram of a Golay cell type optical detector. A particle filled matrix of silicon 50 is etched to form a cavity 52 and a membrane 56. Cavity 52 is closed by another layer of silicon 54 bonded to silicon matrix 50. Cavity 52 may be filled with a gas such as xenon. Incident light interacts with the particles in matrix 50, thus, heating it. The heat is conducted into the gas in cavity 52, causing the gas to expand and push membrane 56 upward in FIG. 6. Movement of the silicon membrane 56 can be sensed by an expansion detector 58 through a suitable connection 60. One such detector 58 could comprise a tunnel current probe positioned very close to the surface of the membrane 56 to measure changes in tunnel current therefrom. Such measurements are well known to those skilled in the art of scanning tunneling microscopes.

In the case of a charge carrier producing optical detector, at least one semiconductor layer, such as layer 18 in FIG. 2, must be added to gather the charge carriers before they are thermalized. However, a plurality of layers, as shown in FIG. 2, produces a more efficient detector 40.

Many variations to the present invention are possible. The above discussion is specific to silicon, which is attractive for its ease of integration with CCD or MOSFET circuitry, and also for the fact that the highest quality epitaxial growth of a metal on a semiconductor has been achieved with cobalt disilicide on silicon. However, other metal silicides using platinum, nickel, or palladium may be used. The metal silicides may be semiconducting. Other matrix materials are a possibility as well. Germanium with germanide particles or compound semiconductors with metal particles comprise other possible systems.

Although optical detectors have been described in greater detail, the inventive optical components using specially shaped particles at selected orientations are useful in filters, memories, optical computer devices, and other optical devices tailored to respond in a linear or non-linear fashion to incident radiation of selected wavelengths. Hence, we intend limitation only in accordance with the appended claims and their equivalents.

We claim:

1. An optical response tailored optical component comprising in combination:
   a semiconductor substrate;
   a matrix of single crystal semiconductor on said substrate; and
   a plurality of metal and semiconductor compound particles embedded in said matrix, the shape of said particles chosen to obtain a desired plasmon resonance frequency.

2. The component of claim 1 in which said matrix and said substrate are silicon and said compound particles are metal silicides.

3. The component of claim 2 in which said metal silicides comprise cobalt disilicide.

4. The component of claim 1 including additional matrix layers with metal silicide particles embedded therein separated by layers of intrinsic semiconductor.

5. The component of claim 4 in which said matrix layers and said substrate are silicon and said compound particles are metal silicides.

6. The component of claim 5 in which said metal silicides comprise cobalt disilicide.

7. The component of claim 1 in which the shape of said particles is elongated, with the aspect ratio of the elongated dimension relative to the dimension perpendicular to the elongated dimension being chosen to obtain a desired optical response.

8. The component of claim 7 in which said particles are oriented with the elongated dimension perpendicular to the substrate.

9. The component of claim 7 in which said elongated dimension of said particles is parallel to the substrate.

10. The component of claim 8 including additional matrix layers with metal silicide particles embedded therein separated by layers of intrinsic semiconductor.

11. The component of claim 10 in which said matrix layers and said substrate are silicon and said compound particles are metal silicides.

12. The component of claim 11 in which said metal silicides comprise cobalt disilicide.

13. The component of claim 9 including additional matrix layers with metal silicide particles embedded therein separated by layers of intrinsic semiconductor.

14. The component of claim 13 in which said matrix layers and said substrate are silicon and said compound particles are metal silicides.

15. The component of claim 14 in which said metal silicides comprise cobalt disilicide.

16. An optical detector having a tailored response comprising:
   a substrate with a matrix layer formed thereon, said matrix comprising a single crystal semiconductor with a plurality of metal and semiconductor compound particles embedded therein, the shape of said particles chosen to favor a desired plasmon resonance frequency; and
   output means connected to said matrix and adapted to measure energy gained by said matrix from interactions with photons.

17. The detector of claim 16 in which said substrate and said single crystal semiconductor are silicon and said particles are metal silicides.

18. The detector of claim 17 in which said metal silicides comprise cobalt disilicide.

19. The detector of claim 18 including additional matrix layers with particles therein, and additional layers of silicon sandwiching the additional matrix layers.

20. The detector of claim 19 in which the shape of said particles is elongated, the ratio of the elongated dimension relative to the shorter dimension being selected to obtain a desired optical response.

21. The detector of claim 20 in which said output means comprises current sensing means.

22. The detector of claim 20 in which said output means comprises heat sensing means.

* * * * *